United States Patent
Honda et al.

(10) Patent No.: US 6,882,222 B2
(45) Date of Patent: Apr. 19, 2005

(54) LOW PASS FILTER FOR OUTPUT OF D-CLASS AMPLIFIER

(75) Inventors: Jun Honda, Tokorozawa (JP); Tsutomu Kawamoto, Tokorozawa (JP)

(73) Assignee: Pioneer Corporation, Tokyo (JP)

( * ) Notice: Subject to any disclaimer, the term of this patent is extended or adjusted under 35 U.S.C. 154(b) by 116 days.

(21) Appl. No.: 10/134,696

(22) Filed: Apr. 30, 2002

(65) Prior Publication Data

US 2002/0196078 A1 Dec. 26, 2002

(30) Foreign Application Priority Data

May 1, 2001 (JP) ........................................ 2001-133920

(51) Int. Cl.[7] .......................... H03F 3/217; H03F 3/191
(52) U.S. Cl. ..................... 330/207 A; 330/251; 330/306
(58) Field of Search ............................. 330/207 A, 251, 330/306

(56) References Cited

U.S. PATENT DOCUMENTS

| | | | |
|---|---|---|---|
| 5,113,145 A | 5/1992 | Ideler et al. | 330/251 |
| 6,229,388 B1 * | 5/2001 | Nalbant | 330/207 A |
| 6,392,476 B1 * | 5/2002 | Rodriguez | 330/207 A |

OTHER PUBLICATIONS

European Search Report dated Nov. 21, 2003.
"IPA032D02 Class–D Stereo Audio Amplifier Evaluation Module, SL0U066", Apr. 2000, Texas Instruments, pp. 1.1–3.30.

* cited by examiner

Primary Examiner—Robert Pascal
Assistant Examiner—Khanh Van Nguyen
(74) Attorney, Agent, or Firm—McGinn & Gibb, PLLC (57) ABSTRACT

Low pass filters at the output stage of a D-class amplifier, in which a high channel separation between adjacent signal amplifying channels, a small size, implementation at a high density can be attained. Induced electromotive forces by a leakage magnetic flux from the adjacent channels are set off by a plurality of pairs of inductors in one low pass filter. The low pass filter of each channel is formed by the same construction and the same circuit. The inductors are arranged in a manner that center axes of coils of the two corresponding pairs of inductors in the adjacent channels are located at vertexes of a rectangular parallelogram, and combinations of the winding directions of the coils of the corresponding inductors of the adjacent channels are set to the same direction and the opposite directions every other inductor.

12 Claims, 5 Drawing Sheets

MARK INDICATING START OF WINDING OF INDUCTOR L

LOW PASS FILTER FOR OUTPUT OF D-CLASS AMPLIFIER

BACKGROUND OF THE INVENTION

1. Field of the Invention

The invention relates to a low pass filter for the removal of harmonics, which is connected to an output stage of a D-class amplifier having a plurality of channels.

2. Description of Related Art

In recent years, amplifiers using the so called D-class amplification have been widely used following the demand for miniaturization and realization of a high efficiency amplifying apparatus.

The D-class amplification is an amplifying scheme in which a modulating process such as pulse width modulation (PWM) or pulse density modulation (PDM) is performed to an analog signal supplied to an amplifying circuit, the processed analog signal is converted into a digital signal, thereafter, the digital signal is amplified, harmonics in an output are removed by a low pass filter, and the digital signal is returned to the analog signal. According to a D-class amplifier, since the amplification of the digital signal, that is, the amplification of the analog signal can be performed only by an ON/OFF process of the signal, logically electric power efficiency of 100% can be obtained.

As a low pass filter for an output stage of the D-class amplifier, it is general to use a low pass filter of the so called LC type which comprises an inductor and a capacitor and of which an electric power loss is small. For use in the D-class amplifier, it is also desirable to miniaturize the low pass filter used at the output stage so that circuit elements arrangement on a printed circuit board can be integrated. This is because the high electric power efficiency and the miniaturization can be accomplished with a D-class amplifier, as mentioned above.

Since coils obtained by winding conductors are generally used as inductors which are used for the low pass filter, however, if a load current flows in the inductors included in the low pass filter provided for one channel output, a change in magnetic flux occurs. When the magnetic flux is interlinked with inductors included in a low pass filter of another channel, an induced electromotive force is caused in the other inductor due to an electromagnetic induction phenomenon.

Therefore, when the low pass filters at the output stage of the D-class amplifier having a plurality of output channels are integrated on a printed circuit board and arranged closely, interlinkage of the leakage magnetic flux from the inductor or inductors in the low pass filter of the adjacent channel may occur in the inductor or inductors of the low pass filter of the other channel. In that case, the leakage of the signal occurs between channels, and the separation between channels eventually deteriorates.

In other words, in the case of the multichannel D-class amplifier, it is extremely difficult to preferably maintain separation between both of the adjacent channels while realizing the miniaturization and integration of the low pass filter at the output stage.

In order to improve the channel separation, it is conceivable to use an inductor having a core of a closed magnetic path type in which a leakage magnetic flux is small. With respect to the output stage of the D-class amplifier, it is however necessary to provide a magnetic gap for a magnetic path so that it is difficult to completely eliminate the leakage magnetic flux because the load current at the output stage is usually large and magnetic saturation is likely to occur.

OBJECTS AND SUMMARY OF THE INVENTION

The invention has been made to solve the points mentioned above and it is an object of the invention to provide a small low pass filter for output of a multichannel D-class amplifier in which prevention of the magnetic saturation of the inductor is sought while maintaining the separation between adjacent channels preferably.

According to the invention, there is provided a low pass filter for output in a D-class amplifier having two or more signal amplifying channels, wherein each of the signal amplifying channels includes an even number of inductors, the low pass filter includes
a first pair of inductors comprising inductors which are included in one of the signal amplifying channels and arranged so as to be adjacent to each other and an electrical connection is made, and
a second pair of inductors comprising inductors which are included in one signal amplifying channel arranged in parallel so as to be adjacent to the one of signal amplifying channels and which are arranged so as to be adjacent to each other and connected, induced electromotive forces which are caused in the second pair of inductors by a leakage magnetic flux from the first pair of inductors are set off between the inductors included in the second pair of inductors, and induced electromotive forces which are caused in the first pair of inductors by a leakage magnetic flux from the second pair of inductors are set off between the inductors included in the first pair of inductors.

DETAILED DESCRIPTION OF THE PREFERRED EMBODIMENTS

Figure 1:
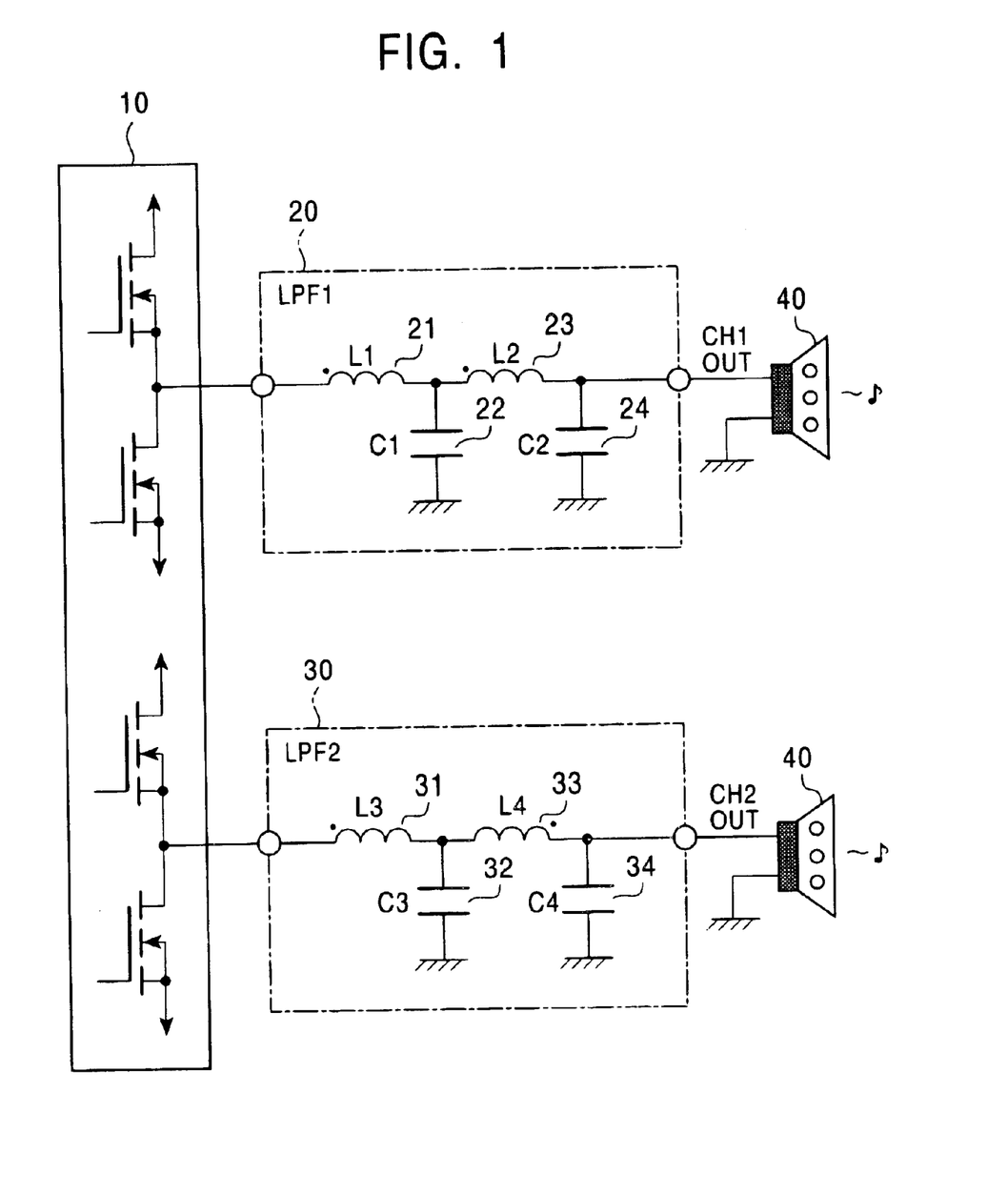
FIG. 1 is a circuit diagram showing a construction of a low pass filter for output of a D-class amplifier according to an embodiment of the invention.

FIG. 1 is a circuit diagram showing a construction of a low pass filter for output of a D-class amplifier according to the invention.

In FIG. 1, a D-class amplifier IC (10) is, for example, a power amplifying IC having therein D-class amplifiers of a plurality of channels which construct an output stage circuit by an MOS-FET, and an output at the final stage is connected to the low pass filter for output every channel.

Although the number of output channels of the multichannel D-class amplifier is set to, for example, 2 channels like a general stereophonic apparatus in the embodiment, the invention is not limited to it but it is sufficient to use the multichannel D-class amplifier having a plurality of channels of two or more. In the embodiment, those channels are referred to as a channel 1 (hereinafter, referred to as CH1) and a channel 2 (hereinafter, referred to as CH2), and it is presumed that constructions and contents of those channels are substantially the same.

A low pass filter 1 (20) (hereinafter, simply referred to as LPF1) is a low pass filter connected to an output of CH1 of the D-class amplifier IC (10) and is an LC type filter whose signal transfer function shows, for example, Butterworth characteristics or Chebyshev characteristics. The transfer function can be realized by using inductors as serial elements and using capacitors as parallel elements and sequentially cascade connecting those elements in a ladder form as shown in the circuit diagram of FIG. 1. Since the LPF1 exhibits large attenuating characteristics in a range of a predetermined frequency determined by the transfer function or higher, harmonic components of signal frequencies included in an output signal of CH1 can be sufficiently suppressed.

As an inductor L1 (21) and an inductor L2 (23) (hereinafter, simply referred to as L1 and L2) constructing the LPF1, for example, coils wound around bobbins or simple air-core coils can be used. Coils each having a core made of ferrite or another magnetic material can be also used.

In FIG. 1, a black dot added to the side of each inductor indicates the start of winding of the coil constructing the inductor, as will be explained hereinlater.

A capacitor C1 (22) and a capacitor C2 (24) (hereinafter, simply referred to as C1 and C2) are capacitors such as ceramic capacitors or laminated type Mylar capacitors and function so as to realize the attenuating characteristics by the transfer function of the LPF1 together with the inductors.

The order of the LPF1, that is, the number of inductors and capacitors included in the low pass filter is not limited to the number shown in the embodiment but determined in accordance with harmonic suppressing characteristics which are necessary as a low pass filter for output of the D-class amplifier. When taking into consideration an operation principle of the invention, a condition that the number of inductors included in the low pass filter is an even number is assumed to be a necessary condition. The low pass filter in the embodiment has a construction of the forth order, that is, it has two inductors.

Each speaker (40) converts an output electric signal from the LPF1 into an acoustic signal and generates it as a sound.

A low pass filter 2 (30) (hereinafter, simply referred to as LPF2) is a low pass filter connected to an output of CH2 of the D-class amplifier and constructed by an inductor L3 (31), an inductor L4 (33), a capacitor C3 (32), and a capacitor C4 (34) (hereinafter, simply referred to as L3, L4, C3, and C4, respectively). Since a circuit construction and each component element of the LPF2 are substantially the same as those of the LPF1, their descriptions are omitted here.

In the embodiment shown in FIG. 1, the circuit constructions, component elements, and circuit constants of the LPF1 and LPF2 are substantially the same. Subsequently, a physical arrangement of the component elements of the LPFs on a printed circuit board will be described.

Figure 3A:
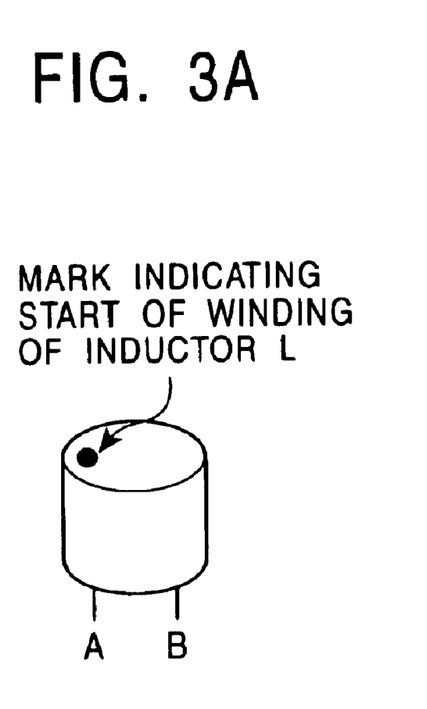
FIGS. 3A and 3B are constructional diagrams showing a structure of an inductor.
Figure 3B:
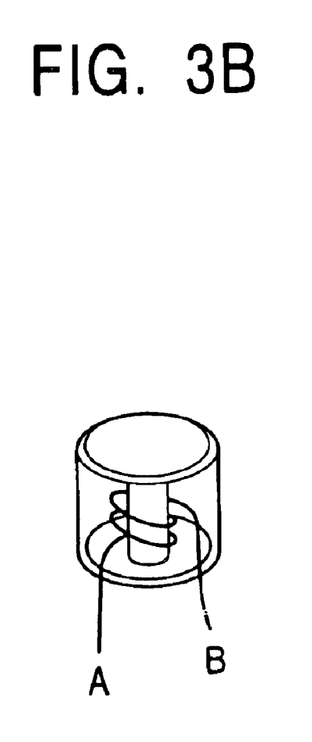

An inductor has an external view having a cylindrical inductor casing as shown in FIG. 3A and its inside is constructed by a coil wound like a cylinder around a bobbin as shown in FIG. 3B. As shown in FIG. 3A, a mark indicative of the start of the winding of the coil is written onto an upper surface portion of the inductor casing. Whether a terminal to supply a current to the inductor is set to an A side or a B side shown in the diagram is determined by using the mark as a reference point, and the inductor can be arranged.

Figure 2A:
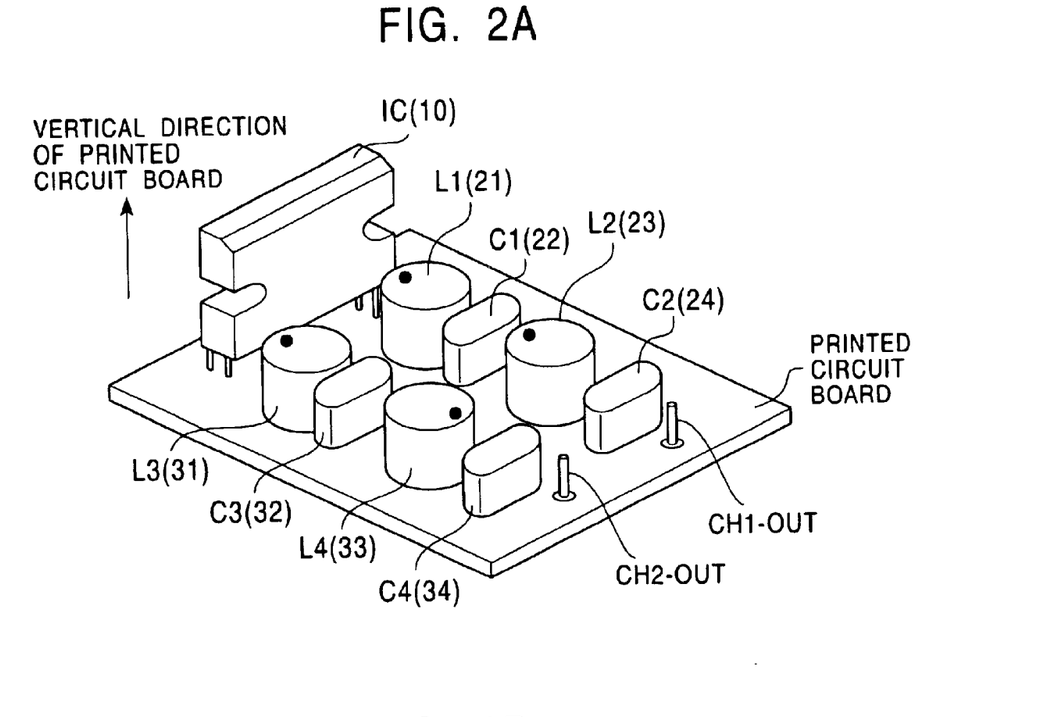
FIGS. 2A and 2B are diagrams showing an arrangement of component elements of the filter in the circuit of FIG. 1.

As shown in FIG. 2A, each inductor is implemented onto the printed circuit board in the direction such that a diameter of the cylindrical coil is parallel with the printed circuit board. A center axis of the coil and the generating direction of a magnetic flux are, therefore, perpendicular to the printed circuit board.

In the embodiment, it is presumed that the circuit constructions, component elements, and circuit constants of the LPFs included in CH1 and CH2 are substantially the same. Assuming that, therefore, the two inductors which are included in the LPF1 of CH1 and connected so as to be adjacent to each other are set to a first pair of inductors, also in the LPF2 of CH2, a second pair of inductors arranged at the same positions also on the circuit diagram as those of the first pair of inductors exist in correspondence to the first pair of inductors. That is, assuming that L1 and L2 included in the LPF1 of CH1 are the first pair of inductors, L3 and L4 included in the LPF2 of CH2 are the second pair of inductors.

Figure 2B:
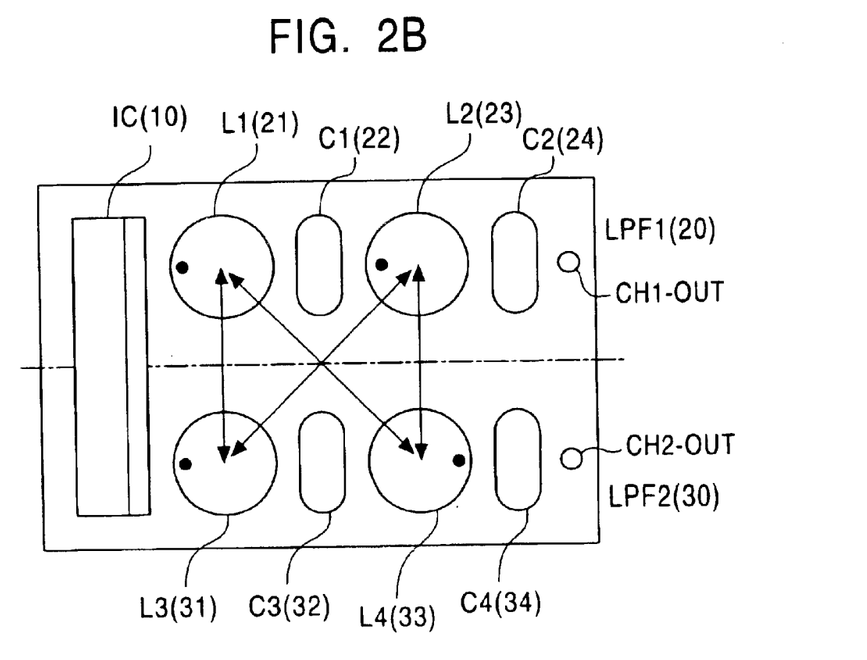

As shown in FIGS. 2A and 2B, L1 to L4 included in the LPF1 and LPF2 are arranged on the printed circuit board in a manner such that they are located at vertexes of a rectangular parallelogram on the printed circuit board. Distances between the corresponding inductors with respect to the inductor pairs of the LPF1 and LPF2, therefore, that is, a distance between the center axes of the coils of L1 and L3 and that of L2 and L4 are equal. Distances between the inductors of a different correspondence relation with respect to the two inductor pairs, that is, a distance between the center axes of the coils of L1 and L4 and that of L2 and L3 are also equal.

A mutual inductance M between the two inductors is unconditionally determined only by the physical arrangements of both inductors irrespective of load currents or voltages of the inductors. A mutual inductance between L1 and L3 is, therefore, determined as M13. In a manner similar to the above, a mutual inductance between L2 and L4 is assumed to be M24, that between L1 and L4 is assumed to be M14, and that between L2 and L3 is assumed to be M23, respectively. The following relational equations are satisfied among the mutual inductance between the respective inductors arranged as shown in FIGS. 2A and 2B.

$$M13=M24, M14=M23 \qquad (1)$$

Since symmetry of the mutual inductance has been clarified by the Neumann-Kopp's law in electromagnetism, the following relations are derived between the respective mutual inductance.

$$M13=M31, M24=M42, M14=M41, M23=M32 \qquad (2)$$

A mutual inductance M31 is a mutual inductance at the time when an induced electromotive force e31 which is caused in L3 of the LPF2 is defined by a load current i1 flowing in L1 of the LPF1 and defined by the following relational equation by the rule of electromagnetic induction.

$$e31=-M31\times(di1/dt) \qquad (3)$$

Similarly, an induced electromotive force e13 which is caused in L1 of the LPF1 by a load current i2 flowing in L3 of the LPF2 is defined as follows by using the mutual inductance M13.

$$e13=-M13\times(di2/dt) \tag{4}$$

The operation of the low pass filter for output of the D-class amplifier shown in the embodiment will now be described with reference to circuit diagrams of FIGS. 4A and 4B.

Figure 4A:
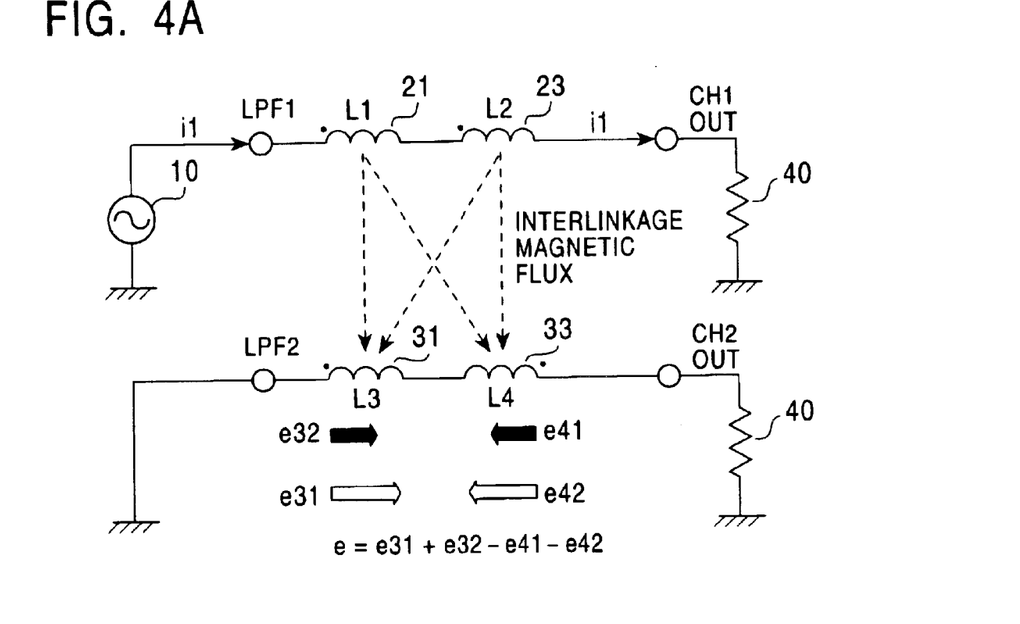
FIGS. 4A and 4B are explanatory diagrams of the operation showing a state where an induced electromotive force in the circuit of FIG. 1 is caused.
Figure 4B:
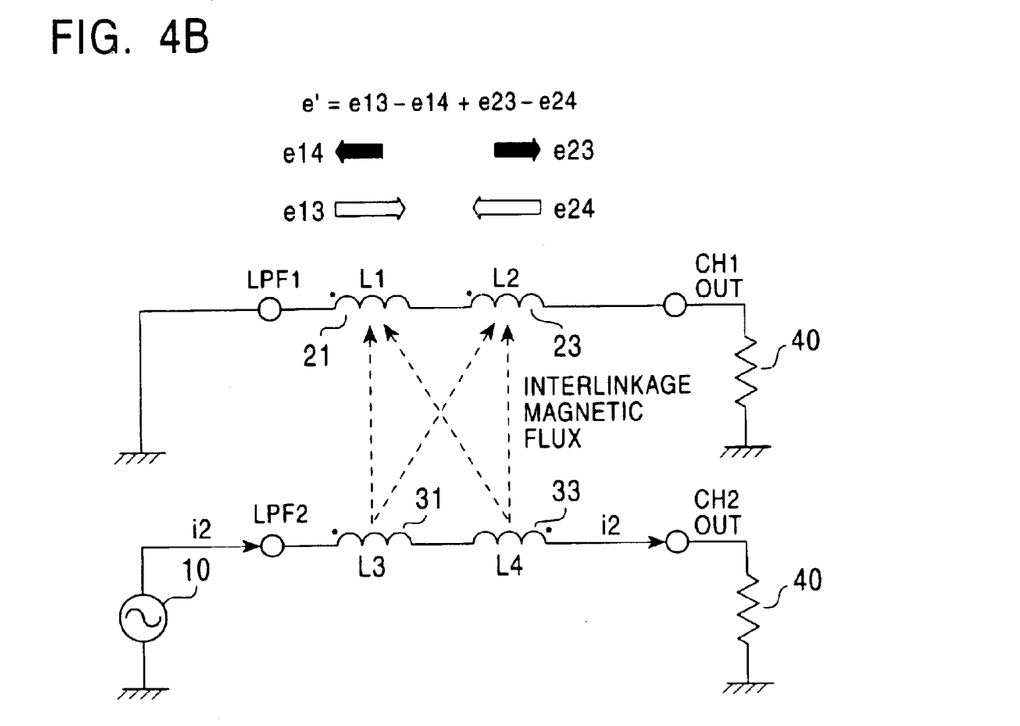

Although the circuits shown in FIGS. 4A and 4B are equivalent to those shown in FIG. 1, in order to make an explanation of the operation in the circuit easy, the D-class amplifier IC (10) is shown as a mere voltage source and the speakers (40) are also shown as mere load resistors. Since the capacitors in the LPF1 and LPF2 are not much concerned with the essential operation in the embodiment, their descriptions are omitted here.

First, FIG. 4A is a diagram for explaining an electromotive force which is induced in each inductor included in the LPF2 when the load current i1 flows in the LPF1. In this case, since the load current i1 flows in L1 and L2 of the LPF1, a change in magnetic flux occurs. When the magnetic flux is interlinked with L3 and L4 of the LPF2, induced electromotive forces are generated in L3 and L4.

The induced electromotive forces that are generated in L3 and L4 by the magnetic flux from L1 are now assumed to be e31 and e41, and similarly, induced electromotive forces that are generated in L3 and L4 by the magnetic flux from L2 are assumed to be e32 and e42, respectively. Assuming that the sum of the induced electromotive forces in the inductors of the whole LPF2 is equal to e, a value of e can be expressed by the following equation.

$$|e|=|e31+e32+e41+e42| \tag{5}$$

where, the positions of the black dot marks indicative of the winding directions with respect to L1-L3 and L2-L3 coincide. That is, with respect to those inductors, their winding directions are the same. With respect to L2-L4 and L1-L4, the positions of the black dot marks are different and the winding directions regarding the respective inductors are opposite.

If the winding directions of the two inductors arranged in a manner such that the center axes of the coils are located on parallel lines coincide, by the current flowing in one inductor, the direction of the electromotive force which is induced in the other inductor is the same as that of the current flowing in the original inductor. If the winding directions of the inductors are opposite, by the current flowing in one inductor, the direction of the electromotive force which is induced in the other inductor is opposite to that of the current flowing in the original inductor. This phenomenon is derived from the rule of the electromagnetic induction.

That is, the induced electromotive force e in the circuit of FIG. 4A can be expressed by the following equation also in consideration of the directions. In the following equation, the directions of the induced electromotive forces e31 and e32 which are caused in the same direction as that of the load current i1 flowing in the LPF1 are set to the positive direction.

$$e=e31+e32-e41-e42 \tag{6}$$

A value of the induced electromotive force which is generated in each inductor can be expressed by the following equations by using the mutual inductance between the inductors.

$$e31=-M31\times(di1/dt) \tag{7-1}$$

$$e32=-M32\times(di1/dt) \tag{7-2}$$

$$e41=-M41\times(di1/dt) \tag{7-3}$$

$$e42=-M42\times(di1/dt) \tag{7-4}$$

The sum e of the electromotive forces which are generated in the inductors included in the LPF2 is obtained by the equations (6) and (7).

$$e=(-M31-M32+M41+M42)\times(di1/dt) \tag{8}$$

In the embodiment, the values of the mutual inductance between the inductors are M13=M24 and M14=M23 by the equation (1). As mentioned above, it will be obviously understood from the equation (2) by the Neumann-Kopp's law that M13=M31, M24=M42, M14=M41, and M23=M32, respectively.

Relations of M31=M42 and M32=M41 are, therefore, derived by combining the equations (1) and (2), so that the sum e of the electromotive forces in the LPF2 is obtained by the following equation.

$$e = (-M31 - M32 + M41 + M42)\times(di1/dt) \tag{9}$$
$$= 0\times(di1/dt)$$
$$= 0$$

That is, the electromotive forces which are generated in the inductors included in the LPF2 of CH2 by the load current i1 flowing in the LPF1 of CH1 are set off by the respective inductors, so that the sum e is equal to 0. In other words, a leakage of the signal from CH1 to CH2 is not caused apparently.

An electromotive force which is induced in each inductor included in the LPF1 when the load current i2 flows in the LPF2 will now be described with reference to FIG. 4B.

In a manner similar to the case of FIG. 4A, assuming that induced electromotive forces which are generated in L1 and L2 by the magnetic flux from L3 are set to e13 and e23 and induced electromotive forces which are generated in L1 and L2 by the magnetic flux from L4 are set to e14 and e24, respectively, a sum e' of the induced electromotive forces which are generated in the inductors of the whole LPF1 can be expressed by the following equation.

$$|e'|=|e13+e14+e23+e24| \tag{10}$$

As mentioned above, the winding directions of the inductors included in each low pass filter with respect to L1–L3 and L2–L3 are the same and those of L1–L4 and L2–L4 are opposite. Assuming that, therefore, the direction of the induced electromotive force e13 which is generated in L1 by the load current i2 flowing in L3 is positive, a value of e' is obtained by the following equation.

$$e'=e13-e14+e23-e24 \tag{11}$$

In a manner similar to the case of FIG. 4A, when the value of each induced electromotive force is expressed by using the mutual inductance between the inductors and they are further arranged, e' can be expressed by the following equation.

$$e'=(-M13+M14-M23+M24)\times(di2/dt) \tag{12}$$

where, since M13=M24 and M23=M14 from the relation between the mutual inductance, the value in the equation (12) is eventually equal to e'=0.

That is, according to the embodiment, not only the sum of the electromotive forces which are generated in the inductors included in CH2 by the load current i1 of CH1 but also the sum of the electromotive forces which are generated in the inductors included in CH1 by the load current i2 of CH2 can be set to 0. The leakage, therefore, of the signal between channels can be prevented and the separation between channels can be preferably held.

Figure 5:
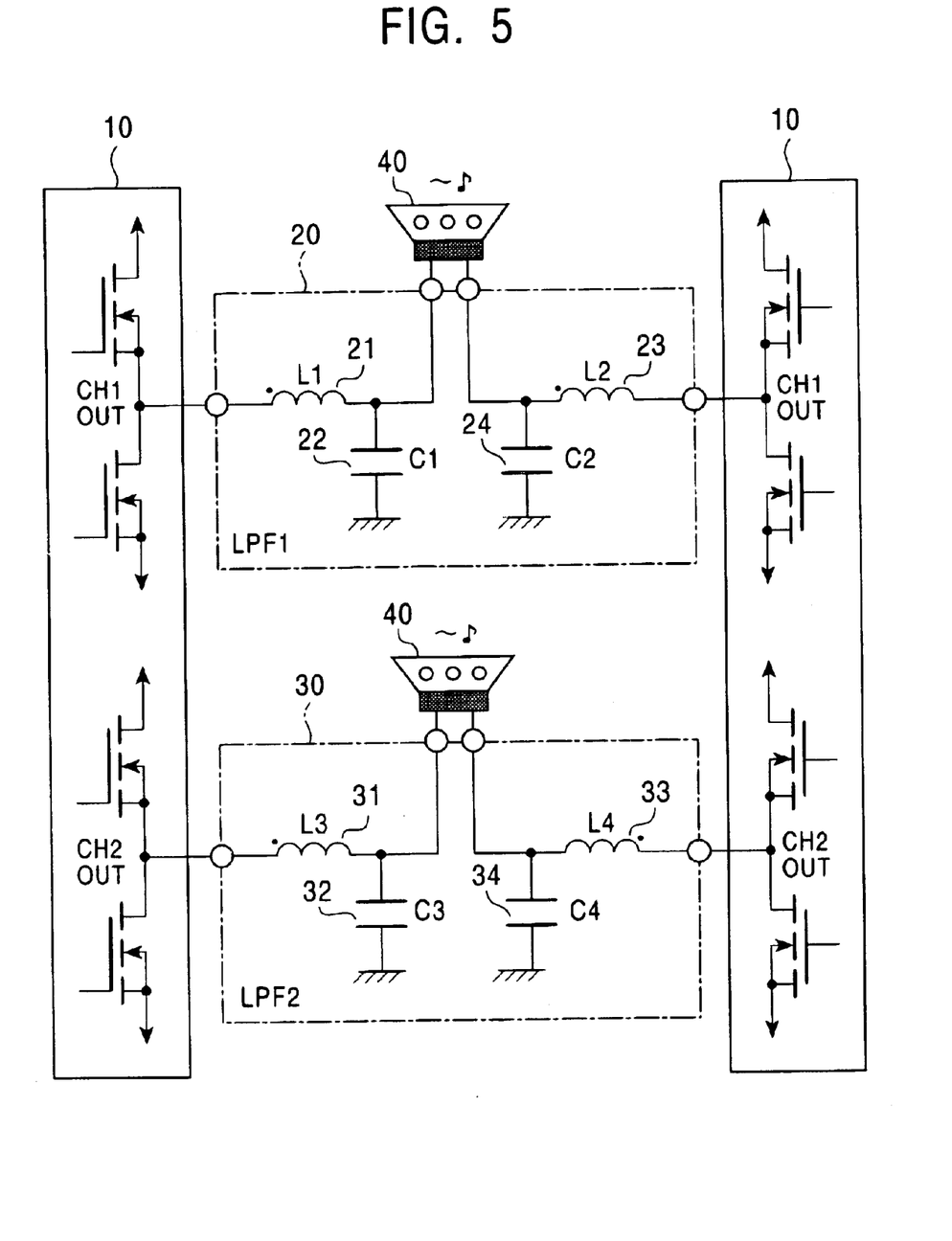
FIG. 5 is a circuit diagram showing an embodiment in the case where the invention is applied to a D-class amplifier of a BTL output system.

Another embodiment of the invention is shown in a circuit diagram of FIG. 5. The circuit of FIG. 5 shows the construction of the low pass filter circuit in the case where the output stage of the D-class amplifier uses the BTL (Balanced Tied Load) system.

The BTL system is an output stage system of an amplifier in which loads are connected between output terminals of two SEPP (Single Ended Push-Pull) circuits of opposite phases. By using the output system, DC currents flowing in the loads can be set off by a balance of the two SEPP circuits existing on both sides of the loads.

Also in the circuit shown in FIG. 5, the winding directions of the inductors included in the LPF1 connected between the two output stages of CH1 and the LPF2 of CH2 are set in a manner similar to those in the circuit shown in FIG. 1. It is assumed that the physical arrangements of the inductors on a printed circuit board of the circuit of FIG. 5 are similar to those in the cases of FIGS. 2A and 2B with respect to the LPF1 and LPF2.

Also in case of the BTL system, the same load currents as those in case of FIG. 1 flow in the pair of D-class amplifiers which operate at the opposite phases. As described with respect to the circuits of FIGS. 4A and 4B, therefore, the electromotive forces which are induced in the inductors included in the low pass filter of one channel by the leakage magnetic flux from the other channel are set off by the pair of inductors at the adjacent stages included in the low pass filter.

That is, also in the circuit of FIG. 5, the leakage magnetic flux that is caused from one channel does not exercise an influence to the other adjacent channel. Even if the leakage magnetic flux is caused between the channels, the separation between the channels is preferably held.

According to the low pass filter for output of the D-class amplifier of the invention, while the separation between the channels is preferably held, the low pass filter for output of a plurality of channels can be integrated and implemented onto the printed circuit board. The construction of the low pass filter for output of the multichannel D-class amplifier can be miniaturized.

Since the coil of the open magnetic path type core of a large leakage magnetic flux although the structure is simple and cheap can be used as an inductor, the low pass filter in which magnetic saturation is hardly caused by the large load current, the structure is simple, and costs are low can be provided.

This application is based on Japanese Patent Application No. 2001-133920 which is herein incorporated by reference.

What is claim is:

1. A low pass filter system for output in a D-class amplifier having at least two signal amplifying channels, wherein each of said signal amplifying channels includes an even number of inductors, said system comprising:
   a first low pass filter comprising:
      a first pair of inductors comprising inductors which are included in one of said signal amplifying channels and arranged so as to be adjacent to each other and connected; and
   a second low pass filter comprising:
      a second pair of inductors comprising inductors which are included in one signal amplifying channel arranged in parallel so as to be adjacent to said one of signal amplifying channels and which are arranged so as to be adjacent to each other and an electrical connection is made,
   wherein induced electromotive forces are caused in said second pair of inductors by a leakage magnetic flux from said first pair of inductors and are set off between the inductors included in said second pair of inductors, and
   wherein induced electromotive forces are caused in said first pair of inductors by a leakage magnetic flux from said second pair of inductors and are set off between the inductors included in said first pair of inductors.

2. A low pass filter system according to claim 1, wherein said inductors comprising cylindrical coils, and
   wherein a center axis of each of said cylindrical coils included in said first pair of inductors and said second pair of inductors is located at each vertex of a rectangular parallelogram, and, with respect to said first pair of inductors and said second pair of inductors, a combination of the inductors in which a combination of winding directions of the cylindrical coils of the corresponding inductors is set to a same direction and a combination of the inductors in which a combination of winding directions of the cylindrical coils of the corresponding inductors is set to opposite directions are arranged every other inductor in each of said pairs of inductors.

3. The system of claim 1, further comprising:
   a plurality of additional inductors in said first low pass filter; and
   a plurality of additional inductors in said second low pass filter,
   wherein a number of said plurality of said additional inductors is determined in accordance with harmonic suppressing characteristics for output of said D-class amplifier.

4. A low pass filter system for output in a D-class amplifier having at least two signal amplifying channels, comprising:
   a first low pass filter comprising:
      a first pair of inductors comprising inductors which are included in one of said signal amplifying channels and arranged so as to be connected; and
   a second low pass filter comprising:
      a second pair of inductors which are included in one signal amplifying channel of said amplifier which are arranged so as to be connected,
   wherein induced electromotive forces are caused in said second pair of inductors by a leakage magnetic flux from said first pair of inductors and are set off between the inductors included in said second pair of inductors.

5. The system of claim 4, wherein induced electromotive forces are caused in said first pair of inductors by a leakage magnetic flux from said second pair of inductors and are set off between the inductors included in said first pair of inductors.

6. The system of claim 4, wherein said one signal amplifying channel is arranged so as to be adjacent to said one of signal amplifying channels.

7. The system of claim 4, wherein said first pair of inductors are arranged adjacent to each other, and
   wherein said second pair of inductors are arranged adjacent to each other.

8. The system of claim 4, wherein each of said signal amplifying channels in said system includes an even number of said inductors.

9. The system of claim 4, wherein said inductors comprise cylindrical coils, and
wherein a center axis of each of said cylindrical coils included in said first pair of inductors and said second pair of inductors is located at each vertex of a rectangular parallelogram.

10. The system of claim 9, wherein winding directions of the cylindrical coils of said first pair of inductors and said second pair of inductors are set to a same direction.

11. The system of claim 9, further comprising:
a combination of the inductors in which a combination of winding directions of the cylindrical coils of the corresponding inductors is set to opposite directions and are arranged every other inductor in each of said pairs of inductors.

12. The system of claim 4, further comprising:
a plurality of additional inductors in said first low pass filter; and
a plurality of additional inductors in said second low pass filter,
wherein a number of said plurality of said additional inductors is determined in accordance with a harmonic suppressing characteristic for output of said D-class amplifier.

* * * * *